(12) United States Patent
Saxod et al.

(10) Patent No.: US 11,437,527 B2
(45) Date of Patent: Sep. 6, 2022

(54) ENCAPSULATION COVER FOR AN ELECTRONIC PACKAGE AND FABRICATION PROCESS

(71) Applicant: STMicroelectronics (Grenoble 2) SAS, Grenoble (FR)

(72) Inventors: Karine Saxod, Les Marches (FR); Veronique Ferre, Le Pont-de-Claix (FR); Agnes Baffert, Moirans (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 46 days.

(21) Appl. No.: 16/896,780

(22) Filed: Jun. 9, 2020

(65) Prior Publication Data
US 2020/0303565 A1    Sep. 24, 2020

Related U.S. Application Data

(62) Division of application No. 16/191,625, filed on Nov. 15, 2018.

(30) Foreign Application Priority Data
Nov. 23, 2017    (FR) ...................... 1761101

(51) Int. Cl.
| | | |
|---|---|---|
| *H01L 31/0203* | (2014.01) | |
| *H01L 21/56* | (2006.01) | |
| *H01L 31/0232* | (2014.01) | |
| *H01L 31/18* | (2006.01) | |
| *H01L 31/16* | (2006.01) | |
| *H01L 31/12* | (2006.01) | |
| *H01L 33/48* | (2010.01) | |

(52) U.S. Cl.
CPC ........ *H01L 31/0203* (2013.01); *H01L 21/565* (2013.01); *H01L 31/02322* (2013.01); *H01L 31/12* (2013.01); *H01L 31/162* (2013.01); *H01L 31/18* (2013.01); *H01L 33/483* (2013.01); *H01L 2224/48091* (2013.01)

(58) Field of Classification Search
None
See application file for complete search history.

(56) References Cited

U.S. PATENT DOCUMENTS

| | | |
|---|---|---|
| 7,095,123 B2 | 8/2006 | Prior |
| 2002/0128539 A1 | 9/2002 | Higuma et al. |
| 2003/0128291 A1 | 7/2003 | Harazono et al. |
| 2005/0073036 A1 | 4/2005 | Appelt et al. |
| 2005/0270403 A1 | 12/2005 | Adachi et al. |
| 2007/0253667 A1 | 11/2007 | Brunner et al. |

(Continued)

OTHER PUBLICATIONS

INPI Search Report and Written Opinion for FR 1761101 dated Jun. 20, 2018 (8 pages).

*Primary Examiner* — Shaun M Campbell
*Assistant Examiner* — Aneta B Cieslewicz
(74) *Attorney, Agent, or Firm* — Crowe & Dunlevy (57) ABSTRACT

An encapsulation cover for an electronic package includes a frontal wall with a through-passage extending between faces. The frontal wall includes an optical element that allows light to pass through the through-passage. A cover body and a metal insert that is embedded in the cover body, with the cover body being overmolded over the metal insert, defines at least part of the frontal wall.

17 Claims, 13 Drawing Sheets

(56) References Cited

U.S. PATENT DOCUMENTS

| | | |
|---|---|---|
| 2008/0237768 A1 | 10/2008 | Yajima et al. |
| 2008/0296715 A1 | 12/2008 | Kumata et al. |
| 2010/0231766 A1 | 9/2010 | Moriya et al. |
| 2012/0211640 A1 | 8/2012 | Suzuki |
| 2018/0190838 A1* | 7/2018 | Saxod .................. H01L 33/483 |

* cited by examiner

ENCAPSULATION COVER FOR AN ELECTRONIC PACKAGE AND FABRICATION PROCESS

CROSS REFERENCE TO RELATED APPLICATIONS

This application is a divisional of U.S. application for patent Ser. No. 16/191,625 filed Nov. 15, 2018, which claims the priority benefit of French Application for Patent No. 1761101, filed on Nov. 23, 2017, the contents of which are hereby incorporated by reference in their entireties to the maximum extent allowable by law.

TECHNICAL FIELD

Embodiments of the present invention relate to the field of packages, in particular to those which are intended to contain electronic chips including light radiation emitters and/or light radiation sensors, which may colloquially be referred to as "electronic packages".

BACKGROUND

It is known practice to produce electronic packages that comprise electronic chips mounted on substrate wafers and encapsulation covers for the chips, which covers are mounted on the substrate wafers. These encapsulation covers comprise prefabricated cover bodies that have through-passages and shoulders around these passages and are provided with optical elements allowing light to pass through, which are generally made of glass and are added to the shoulders and attached by means of layers of adhesive.

SUMMARY

According to one embodiment, an encapsulation cover for an electronic package is provided, which cover comprises a frontal wall having at least one through-passage from one face to the other, in which said frontal wall is provided with an optical element allowing light to pass through this through-passage and in which the encapsulation cover includes a cover body and a metal insert that is embedded in the cover body, the cover body being overmolded over the metal insert.

Said frontal wall may comprise at least part of said metal insert and/or at least part of said cover body.

Said through-passage may be at least partly made through said metal insert.

Said metal insert may at least partly surround said optical element.

Said optical element may be attached to said metal insert.

Said through-passage may be at least partly made through said cover body.

Said cover body may be at least partly overmolded around said optical element.

Said through-passage may be at least partly made through said cover body and said metal insert.

Said metal insert may be at a distance from said optical element, said cover body comprising a portion between said optical element and said metal insert.

Said metal insert may have at least one face.

Said cover body may comprise a peripheral wall that protrudes from one side of said frontal wall.

Said cover body may comprise at least one inner wall on the side of said peripheral wall.

An electronic package is also provided, which package comprises a substrate wafer, at least one electronic component including at least one optical sensor and/or one optical emitter, mounted on top of a face of the substrate wafer, and said encapsulation cover, mounted on said face of the substrate wafer so as to form a chamber in which the electronic component is located, the frontal wall of the encapsulation cover being in front of the electronic component.

A process for fabricating at least one encapsulation cover for an electronic package is also provided, which process comprises the following steps: a mold is obtained comprising two parts having opposite faces between which a cavity is made; placing, into said cavity, at least one optical element, through which light is able to pass, and at least one metal insert, the optical element and the metal insert making contact with one of said faces of the mold and the optical element making contact with the other of said faces of the mold; injecting a coating material into the remaining cavity; hardening the coating material to obtain a wall that is overmolded over said optical element and said metal insert, so as to produce at least one encapsulation cover including the metal insert and the optical element and in which said optical element allows light to pass through from one face to the other of said wall; and removing said produced encapsulation cover from the mold.

The process may comprise a later step of cutting through said overmolded wafer at a distance from said optical element and said metal insert.

The process may comprise a prior step of mounting said optical element in a through-passage in said metal insert.

Said optical element may be placed in the cavity of the mold at a distance from the metal insert.

Said optical insert may be placed in contact with said other face of the mold.

BRIEF DESCRIPTION OF THE DRAWINGS

Electronic packages comprising encapsulation covers and modes of fabrication will now be described by way of exemplary embodiments illustrated by the appended drawing, in which.

DETAILED DESCRIPTION

FIGS. 1 to 4 illustrate an electronic package 1 that comprises a substrate wafer 2 including a network of electrical connections 3, from one face to the other of this wafer, and an encapsulation cover 4 that is mounted on a front face 5 of the substrate wafer 2.

The encapsulation cover 4 comprises a frontal wall 6 that is located at a distance in front of the front face 5 of the substrate wafer 2 and a back peripheral wall 7 that protrudes backwards with respect to the frontal wall 6 and a back end edge 7a of which is attached to a peripheral zone of the front face 5 of the substrate wafer 2 by means of a bead of adhesive 8.

Thus, the substrate wafer 2 and the encapsulation cover 4 delimit a chamber 9 between them.

The electronic package 1 comprises an electronic chip 10 that is installed in the chamber 9 and has a back face 11 that is bonded to the front face 5 of the substrate wafer 2, the encapsulation cover 4 being at a distance from the chip 10, the front wall 6 being in front of the electronic chip 10.

According to the example shown, the chip 10 comprises, in its front face 12, two optical sensors 13 and 14 that are longitudinally remote from one another. It will be understood that the chip need not include optical sensors.

The encapsulation cover 4 comprises a transverse inner separating partition 15 that protrudes backwards with respect to the frontal wall 6 and joins two opposite sides of the peripheral wall 7.

The inner separating partition 15 divides the chamber 9 into two spaces 16 and 17 and straddles the chip 10 at a site such that the sensors 13 and 14 are located on either side and at a distance from the inner separating partition 15, inside the spaces 16 and 17.

The inner separating partition 15 has a back edge 18 that is provided with a notch 19 through which the chip 10 passes. A bead of adhesive 20 is interposed between the back edge 18 of the separating partition 15 and the zones of the front face 5 of the substrate wafer 2 that are located on either side of the chip 10 and between the notch 19 and zones of the front face 12 and flanks 12a of the chip 10.

The chip 10 is linked to the network of electrical connections 3 of the substrate wafer 2 by means of electrical wires 21.

An electronic chip 22, which is, for example, bonded to the front face 5 of the substrate wafer 2, beside the chip 10, is installed inside the space 17. The chip 22 comprises, in its front face 23, a light radiation emitter 24 and it is linked to the network of electrical connections 3 by electrical wires 25.

The frontal wall 6 of the cover body 5 of the encapsulation cover 4 has through-passages 26 and 27, from one face to the other, that are provided with optical elements 28 and 29 allowing light to pass through between the spaces 16 and 17 and the exterior, respectively, from one face to the other of the frontal wall 6, the opposite faces of the optical elements 28 and 29 being at least partially uncovered.

The substrate wafer 2, the encapsulation cover 4, the bead of adhesive 8 and the bead of adhesive 20 are made of opaque materials.

The electronic package 1 may operate in the following way.

The emitter 24 of the chip 22 emits light, for example infrared, radiation outwards through the optical element 29. This light radiation present in the space 17 is sensed by the sensor 14 of the chip 10. The sensor 13 of the chip 10 senses external light radiation through the optical element 28.

The optical elements 28 and 29 may be made of glass and either or both of them may be treated so as to form lenses and/or light filters. For example, the optical element 28 may be treated so as to form an infrared filter and an optical lens for focusing light towards the sensor 13.

The optical elements 28 and 29 may have different outlines and different thicknesses.

Advantageously, the electronic package 1 may constitute a means for detecting the proximity of a body in front of the encapsulation cover 4 by processing the signals arising from the sensors 13 and 14.

The encapsulation cover 4 is formed by a cover body 30, made of a molded material, and a metal insert 31 that is embedded in the cover body 30, such that the cover body 30 is overmolded over the metal insert 31, the metal insert 31 being located laterally with respect to the optical elements 28 and 29. For example, the cover body 30 is made of an epoxy resin and the metal insert is made of copper or aluminum.

According to the exemplary embodiment illustrated in FIGS. 1 to 4, in order to form the frontal wall 6 of the encapsulation cover 4, the cover body 30 comprises a plate-shaped portion 32 and the metal insert 31 comprises a plate 33 that is provided with protruding back portions 34 and 35 and that is embedded in a front part of the portion 32. The front face 33a of the plate 33 is uncovered and, optionally, the portion 32 of the cover body 30 has a front peripheral rim 32a surrounding the plate 33. The portion 32 of the cover body 30 covers the back face of the plate 33 of the metal insert 31. The portion 32 of the cover body 30 covers the protruding back portions 34 and 35 of the metal insert 31.

The through-passages 26 and 27 in the frontal wall 6 are formed by through-openings 36 and 37 in the plate 33 of the metal insert 31, which pass through the protruding portions 34 and 35, and by through-openings 38 and 39 in the portion 32 of the cover body 30.

The optical elements 28 and 29 are inserted into the through-openings 36 and 37 in the plate 33 of the metal insert 31 and are attached for example by bonding. The optical elements 28 and 29 allow light to pass from one face to the other of the frontal wall 6.

The cover body 30 comprises a portion 40 that protrudes backwards with respect to its portion 32, which forms the peripheral wall 7 of the encapsulation cover 4, and additionally comprises a portion 41 that protrudes backwards with respect to its portion 32, which forms the transverse inner separating partition 15 of the encapsulation cover 4.

The metal insert 31 may contribute to holding and to positioning the optical elements 28 and 29, may contribute to transferring heat to the exterior, may form a shield against electromagnetic fields and may contribute to strengthening the encapsulation cover 4.

The encapsulation cover 4 may be the result of a wafer-scale fabrication process, which will now be described.

Figure 1:
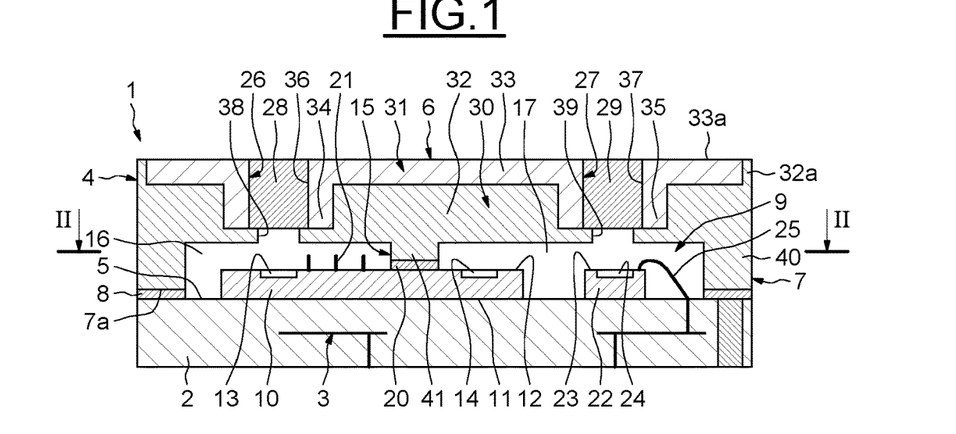
FIG. 1 shows a longitudinal cross section of an electronic package, along I-I of FIG. 2.
Figure 2:
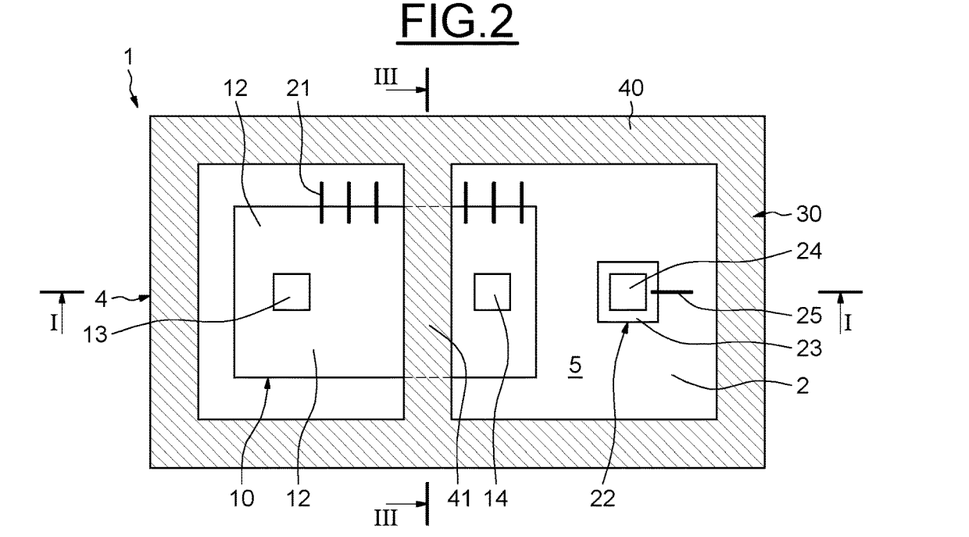
FIG. 2 shows a horizontal cross section of the electronic package of FIG. 1, along II-II of FIG. 1.
Figure 3:
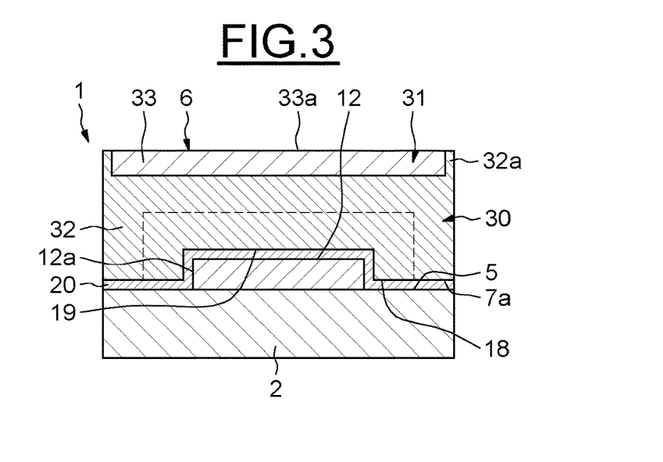
FIG. 3 shows a transverse cross section of the electronic package of FIG. 1, along of FIG. 2.
Figure 4:
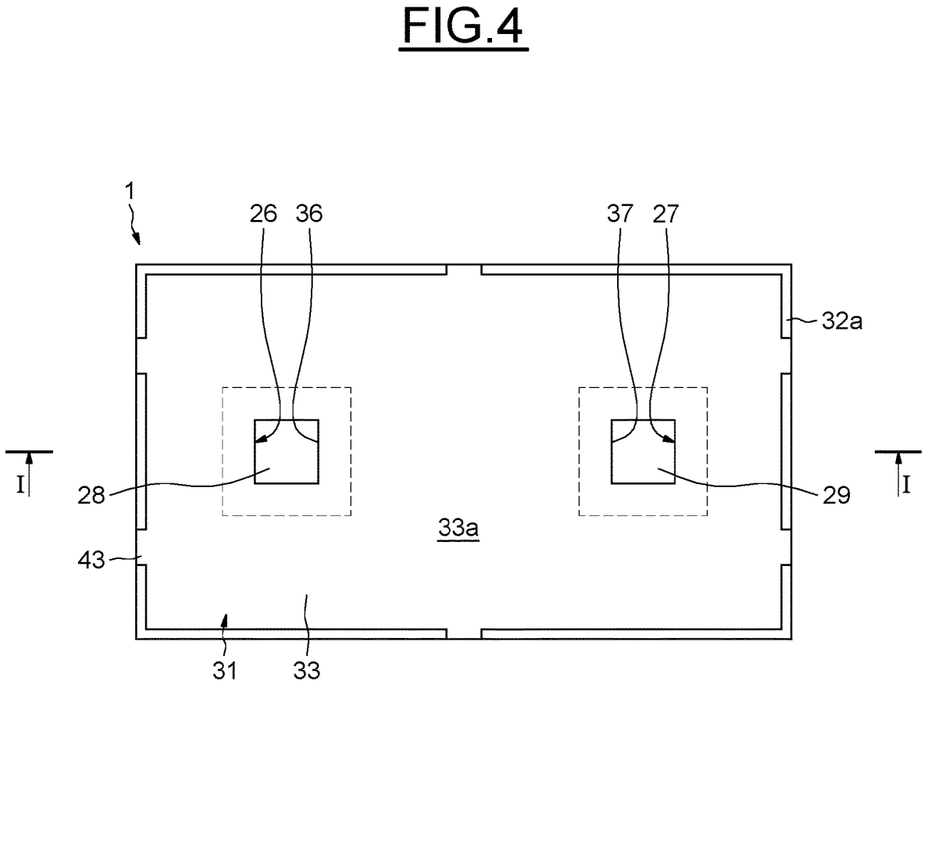
FIG. 4 shows a view from above of the electronic package of FIG. 1.
Figure 5:
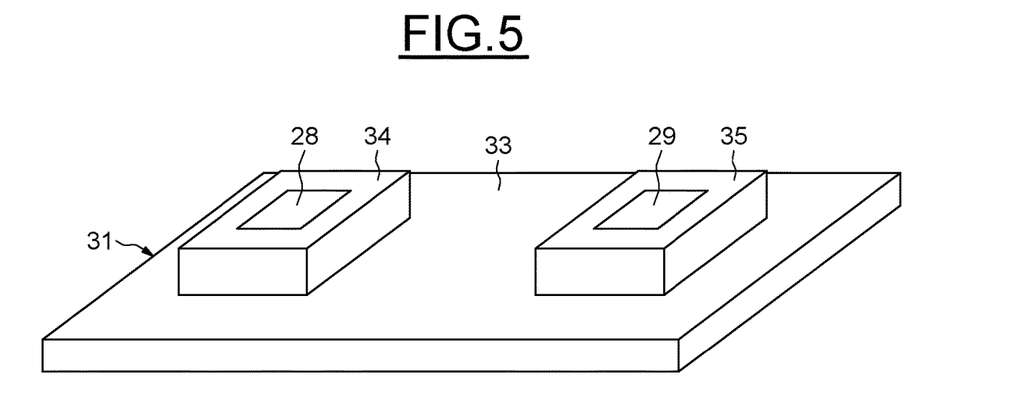
FIG. 5 shows a perspective view of a metal insert of the electronic package of FIG. 1.
Figure 6:
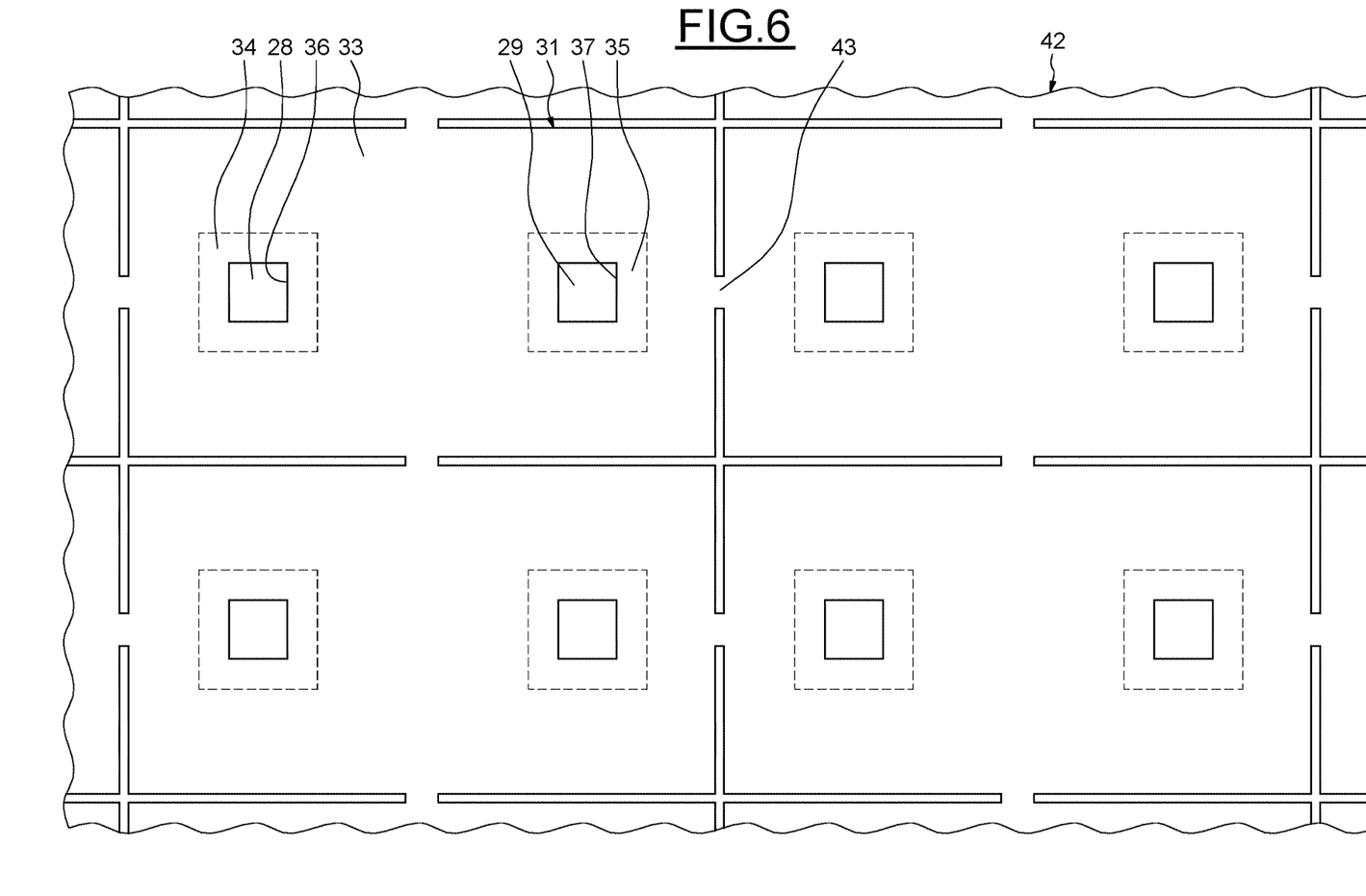
FIG. 6 shows a step of fabricating a wafer with inserts viewed from above.

As illustrated in FIGS. 5 and 6, a collective wafer with inserts 42 is obtained, which wafer is formed by a plurality of metal inserts 31, the plates 33 of which are located beside and at a distance from one another, taking the form of a mosaic, and are linked to one another by local branches 43, the protruding portions 34 and 35 being located on one and the same side.

Optical elements 28 and 29 are inserted into and bonded in the through-openings 36 and 37 in the metal inserts 31.

Figure 7:
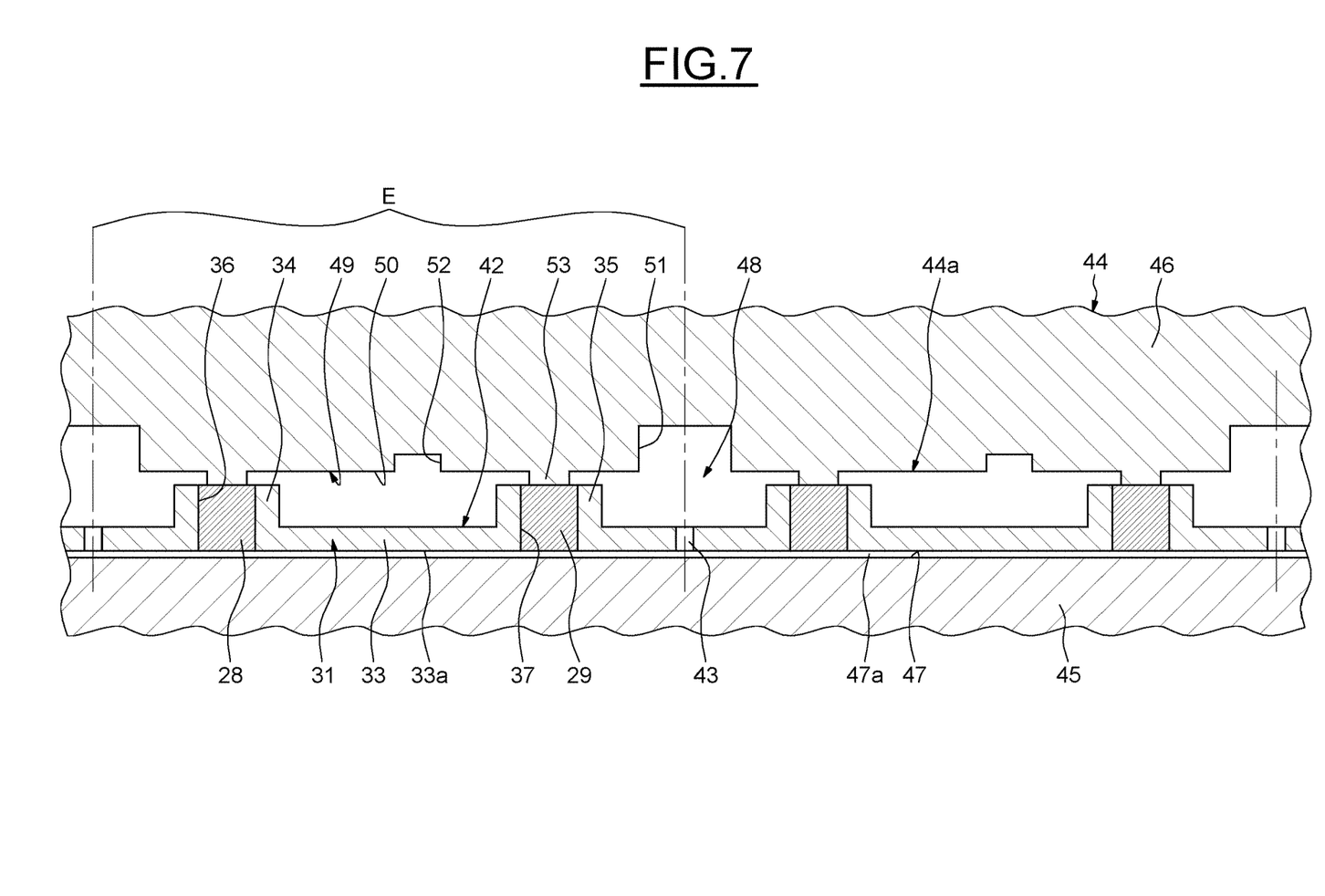
FIG. 7 shows a step of fabricating an encapsulation cover for the package of FIG. 1, in a mold in cross section.

As illustrated in FIG. 7, a mold 44 is obtained comprising a lower part 45 and an upper part 46, delimiting between them a cavity 44a having opposite faces.

The collective wafer 42 formed by arrangements including inserts 31 provided with the optical elements 28 and 29 is installed on top of a face 47 of the lower part 45, by means of a temporary adhesive layer 47a, in a position such that the metal inserts are at sites E. The faces 33a of the inserts 31 are bonded to this layer 47a and the protruding portions 34 and 35 are oriented upwards.

When the lower part 45 and the upper part 46 of the mold 4 are joined together, the collective wafer 42 with inserts 31 and the upper part 46 of the mold 44 delimit, in the cavity 44a, a collective space 47a corresponding to a plurality of cover bodies 30 to be overmolded over the inserts 31 of the collective wafer with inserts 42, which are linked to one another at their peripheries.

The face 49 of the upper part 46 of the mold 44, delimiting the space 48, has a surface 50 that is parallel to the face 47 of the lower part 45 of the mold 44, corresponding to the back faces of the cover bodies 30 to be produced.

In the surface 50, the upper part 46 of the mold 44 has grooves 51 that cross one another, corresponding to the peripheral walls 40 of the cover bodies 30 to be produced, and has grooves 52 corresponding to the inner walls 41 of the cover bodies 30 to be produced.

The surface 5 of the upper part 46 of the mold 44 is provided with protruding local bosses 53, the ends of which make contact with the optical elements 28 and 29, respectively, and correspond to the through openings 38 in the cover bodies 30 to be produced.

Figure 8:
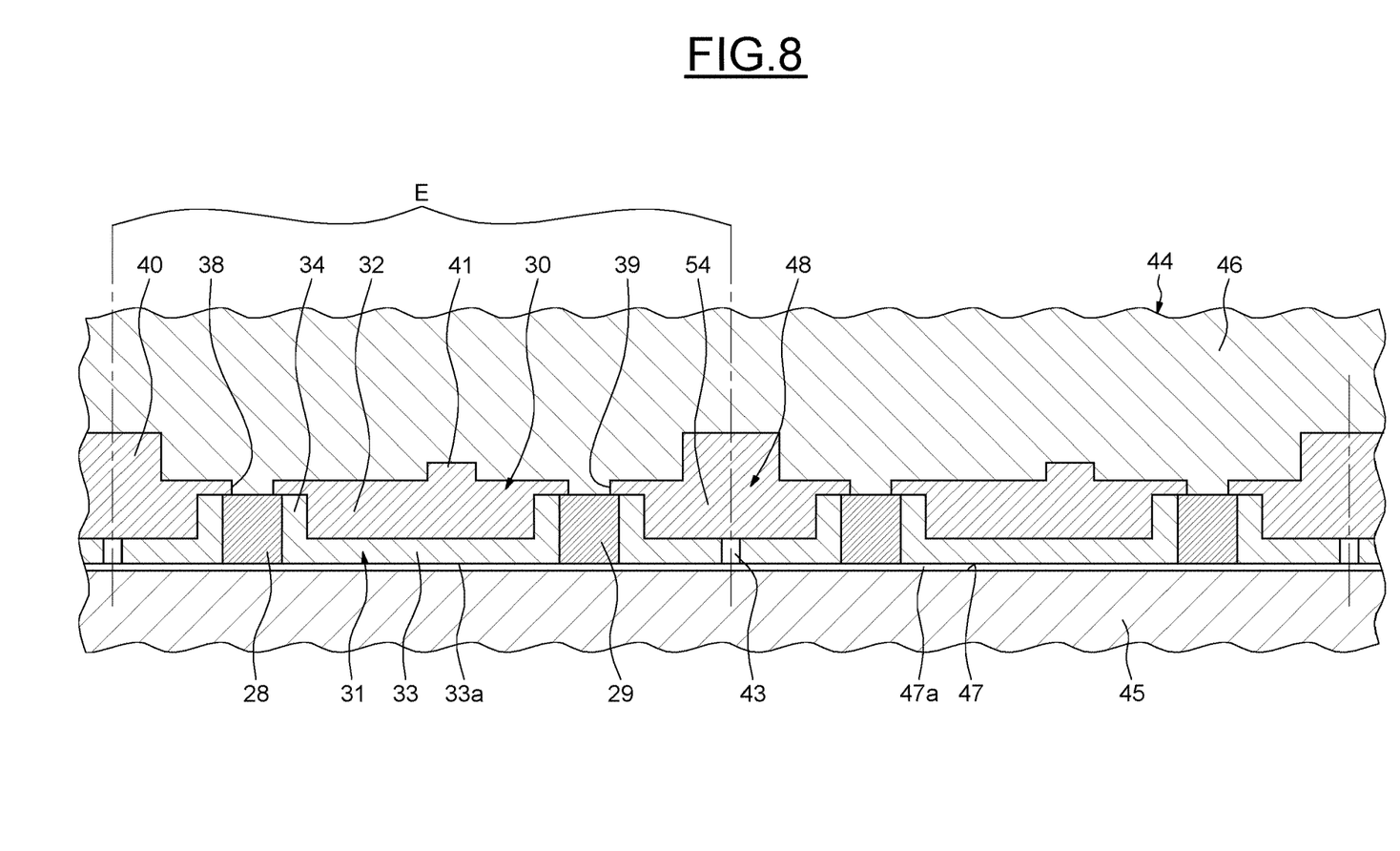
FIG. 8 shows another step of fabricating an encapsulation cover in the mold of FIG. 4.

As illustrated in FIG. 8, a coating material has been injected into the remaining collective space 47 of the mold 44, so as to collectively produce cover bodies 30 at the sites E, which are overmolded over the collective wafer with inserts 42 to form an encapsulated structure.

Figure 9:
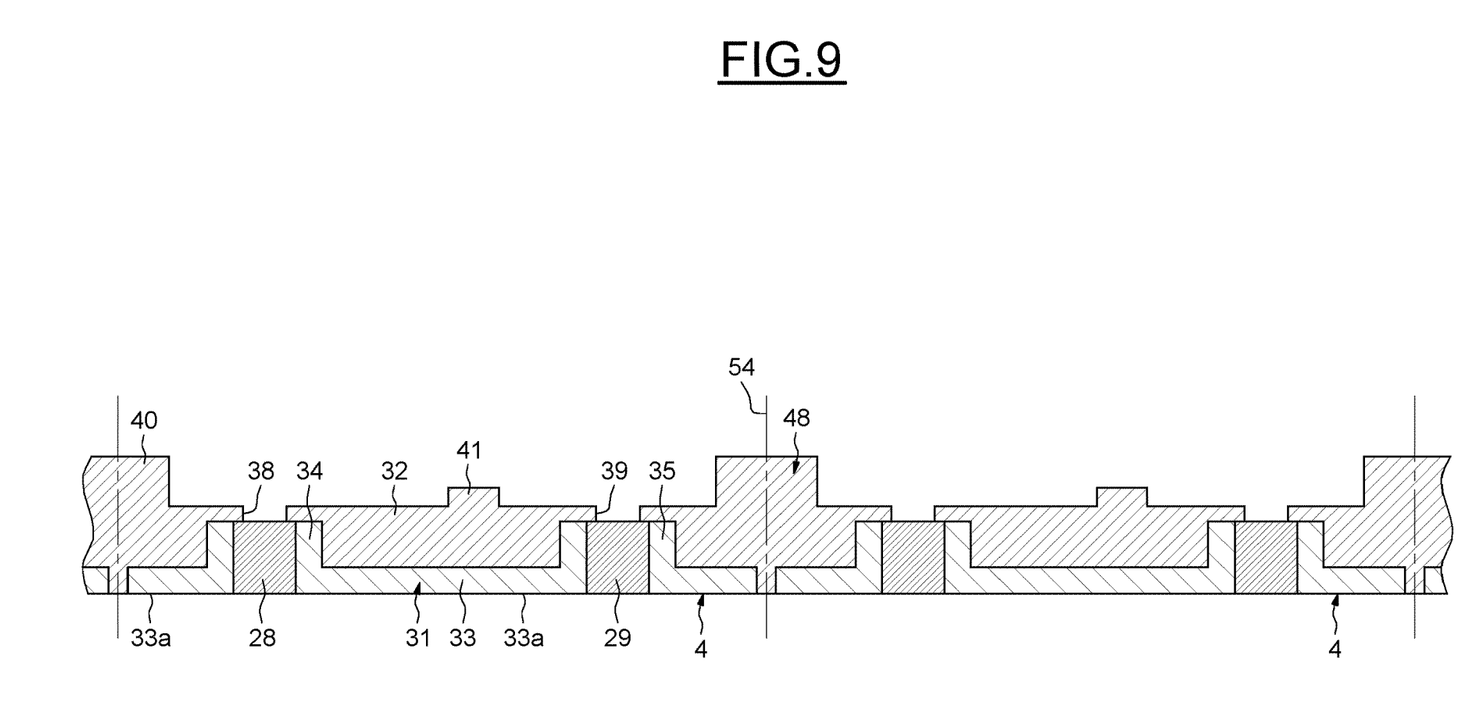
FIG. 9 shows a cross section of a collective wafer out of the mold.

As illustrated in FIG. 9, after cooling, removal of the encapsulated structure from the mold has been carried out. Next, singulation is carried out by longitudinally and transversely cutting along cutting lines 54, for example by sawing, through the linking zones of the cover bodies 30 and through the local branches 43, while passing between and at a distance from the peripheral edges of the plates 33 of the inserts 31, so as to obtain a plurality of encapsulation covers 4.

Figure 10:
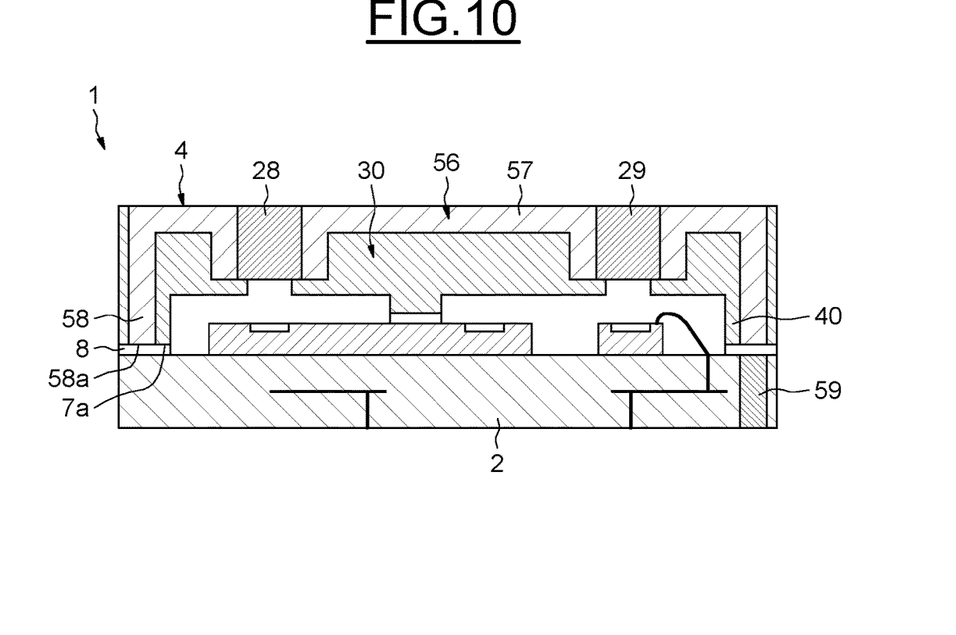
FIG. 10 shows one variant embodiment of the electronic package of FIG. 1, in longitudinal cross section.
Figure 11:
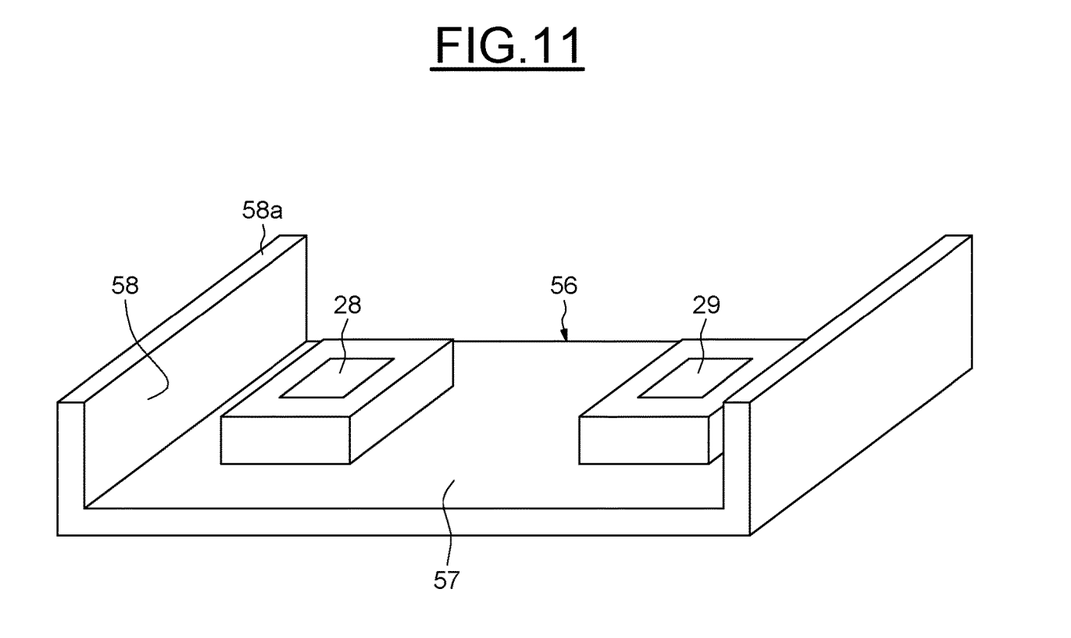
FIG. 11 shows a perspective view of a metal insert of the electronic package of FIG. 10.

FIGS. 10 and 11 illustrate one variant embodiment of the electronic package 1, in which the encapsulation cover 4 is modified, a metal insert 56 replacing the metal insert 31.

The metal insert 56 comprises a plate 57 that is equivalent to the plate 33, provided with optical elements 28 and 29, and further comprises protruding back plates 58 that extend backwards from opposite edges of the plate 57. The back plates 58 extend into and are embedded in the peripheral wall 40 of the cover body 30. The back plates 58 have uncovered back end faces 58a, which are located in the plane of the back end face 7a of the peripheral wall 40 of the cover body 30.

The beads of adhesive 9 and 20 may be made of a heat-conducting material. The substrate wafer 2 may be provided with metal through-vias 59 that are located in the zone of the bead of adhesive 9, with a view to transferring heat to the back via the back plates 58, the bead of adhesive 8 and the vias 58.

Figure 12:
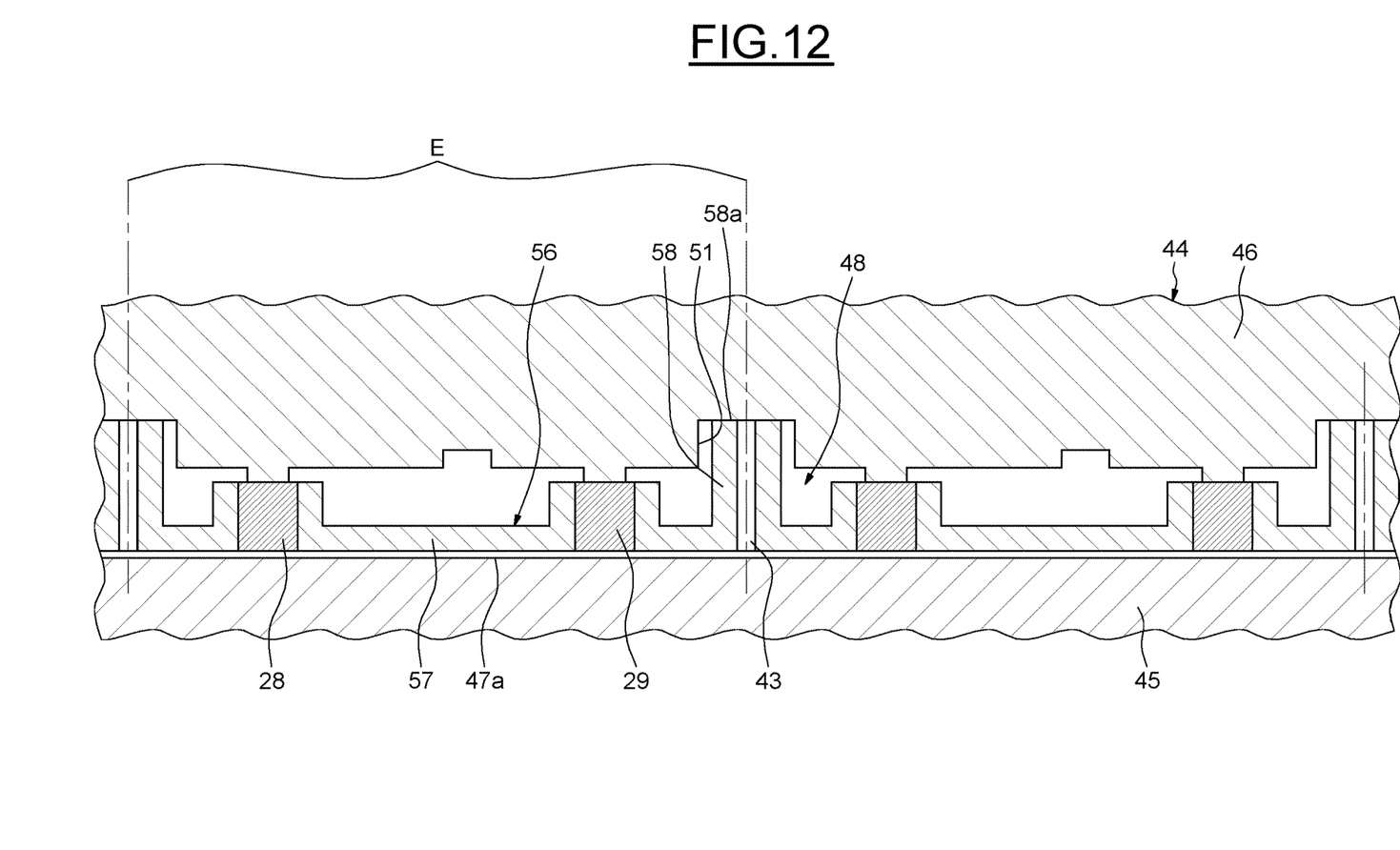
FIG. 12 shows a step of fabricating an encapsulation cover for the electronic package of FIG. 10, in a mold in cross section.

The encapsulation cover 4 thus modified may be the result of a wafer-scale fabrication process that is equivalent to that described above with reference to FIGS. 6 to 9, with the difference that, as illustrated in FIG. 12, the back ends 58a of the back plates 58 of the inserts that are installed in the mold 44 bear against the bottoms of the grooves 51 of the upper part of the mold 44 when the latter is closed. In the cutting operation described above, the cutting lines 54 pass between and at a distance from the back plates 58.

Figure 13:
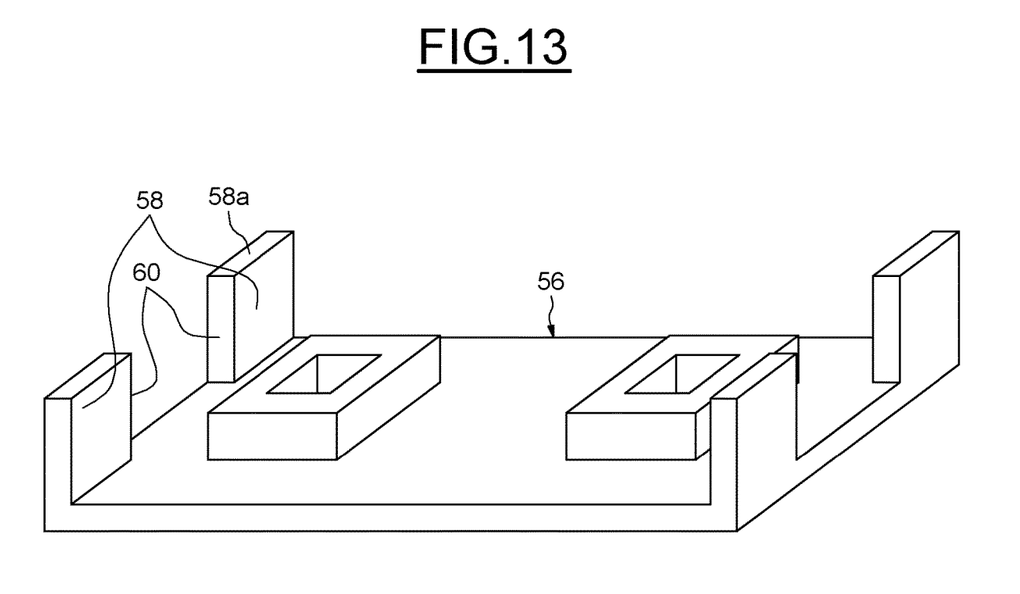
FIG. 13 shows a perspective view of another metal insert of the electronic package of FIG. 10.

FIG. 13 illustrates one variant embodiment of the metal insert 56, in which the back plates 58 are provided with notches 60 from their back ends 58a. In this case, the overmolded cover body 30 fills these notches 60.

Figure 14:
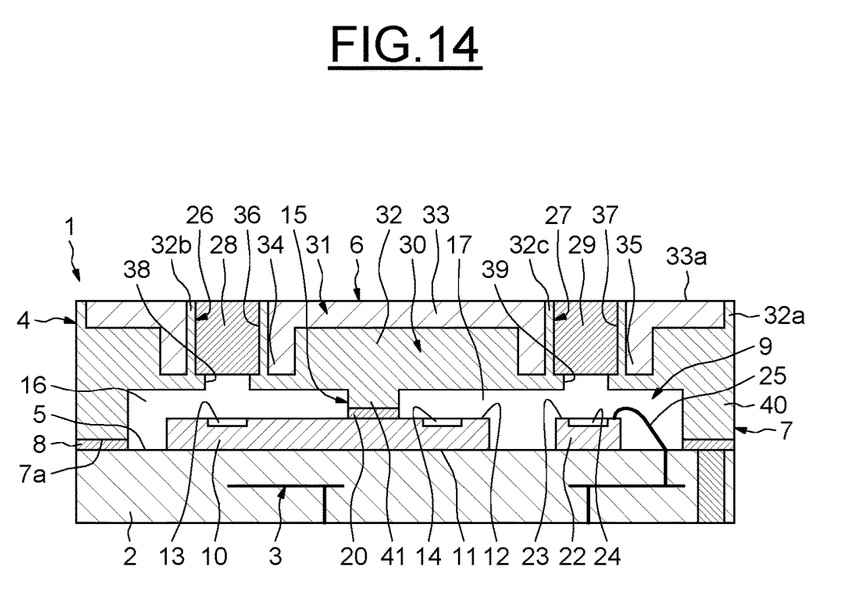
FIG. 14 shows another variant embodiment of the electronic package of FIG. 1, in longitudinal cross section.
Figure 15:
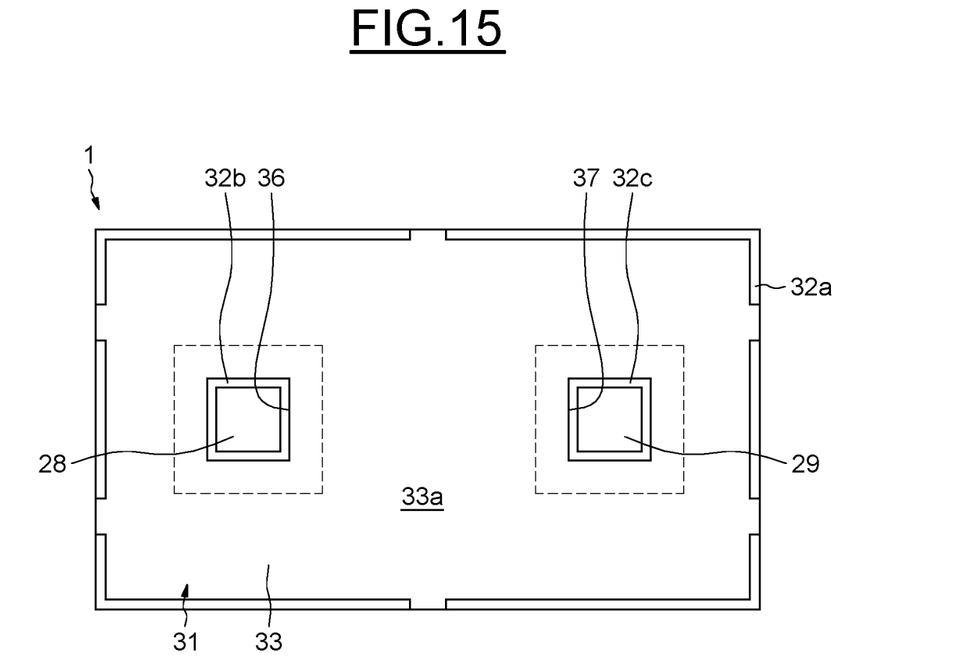
FIG. 15 shows a view from above of the electronic package of FIG. 14.

FIGS. 14 and 15 illustrate one variant embodiment of the electronic package 1, in which the encapsulation cover 4 is modified such that the metal insert 31 is at a distance from the optical elements 28 and 29.

More particularly, the through-openings 36 and 37 in the plate 33 of the metal insert 31 are facing and at a distance from the flanks of the optical elements 28 and 29.

In this case, the overmolded cover body 30 comprises ring-shaped portions 32b and 32c that fill the gaps between the optical elements 28 and 29 and the through-openings 36 and 37 and protrude forwards from the portion 32 of the cover body 30.

The ring-shaped portions 32b and 32c link the optical elements 28 and 29 to the plates 33 and aid in the mounting thereof. Advantageously, the distances between the optical elements 28 and 29 and the through-openings 36 and 37 in the plate 33 are small, such that the optical elements are correctly placed.

The wafer-scale fabrication of encapsulation covers 4 thus modified is modified in the following manner.

Figure 16:
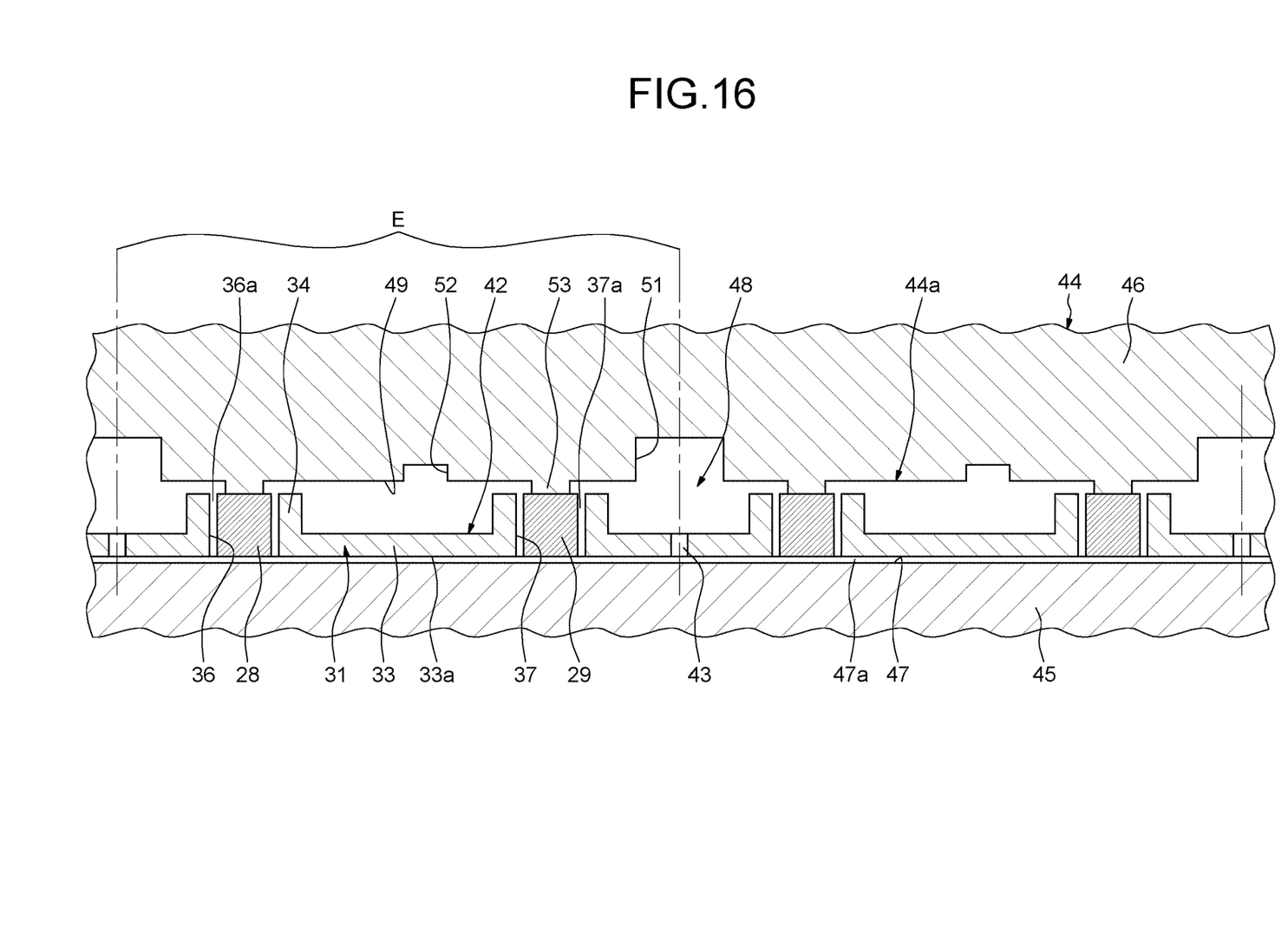
FIG. 16 shows a step of fabricating an encapsulation cover for the electronic package of FIG. 14, in a mold in cross section.

As illustrated in FIG. 16, a collective wafer with inserts 42, without optical elements 28 and 29, is put in place on the adhesive layer 47 of the lower part 45 of the mold 44. Next, the optical elements 28 and 29 are put in place in the through-openings 36 and 37, making contact with the adhesive layer 47a of the lower part 45 of the mold 44, leaving gaps 36a and 37a. As above, the bosses 53 of the mold 44 make contact with the optical elements 28 and 29.

During the operation of injecting the coating material, the gaps 36a and 37a will be filled so as to produce the ring-shaped portions 32b and 32c.

Figure 17:
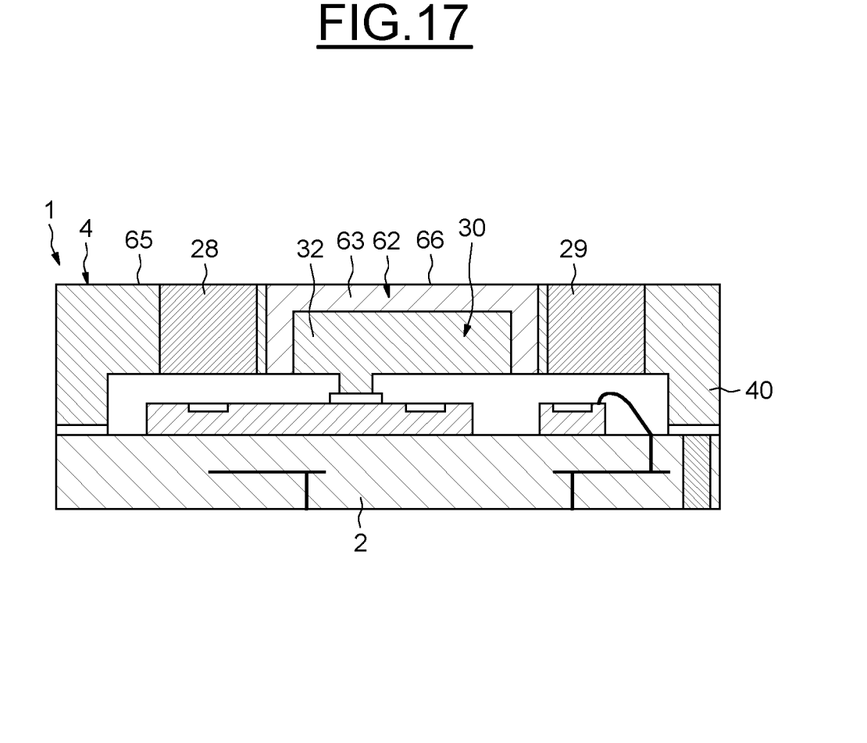
FIG. 17 shows another variant embodiment of the electronic package of FIG. 1, in longitudinal cross section.
Figure 18:
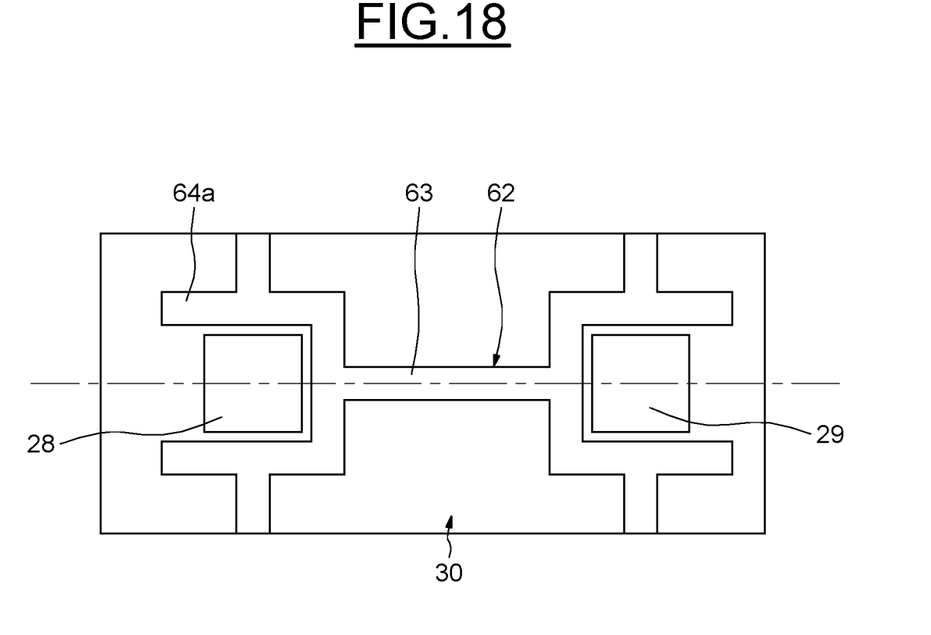
FIG. 18 shows a view from above of the electronic package of FIG. 17.
Figure 19:
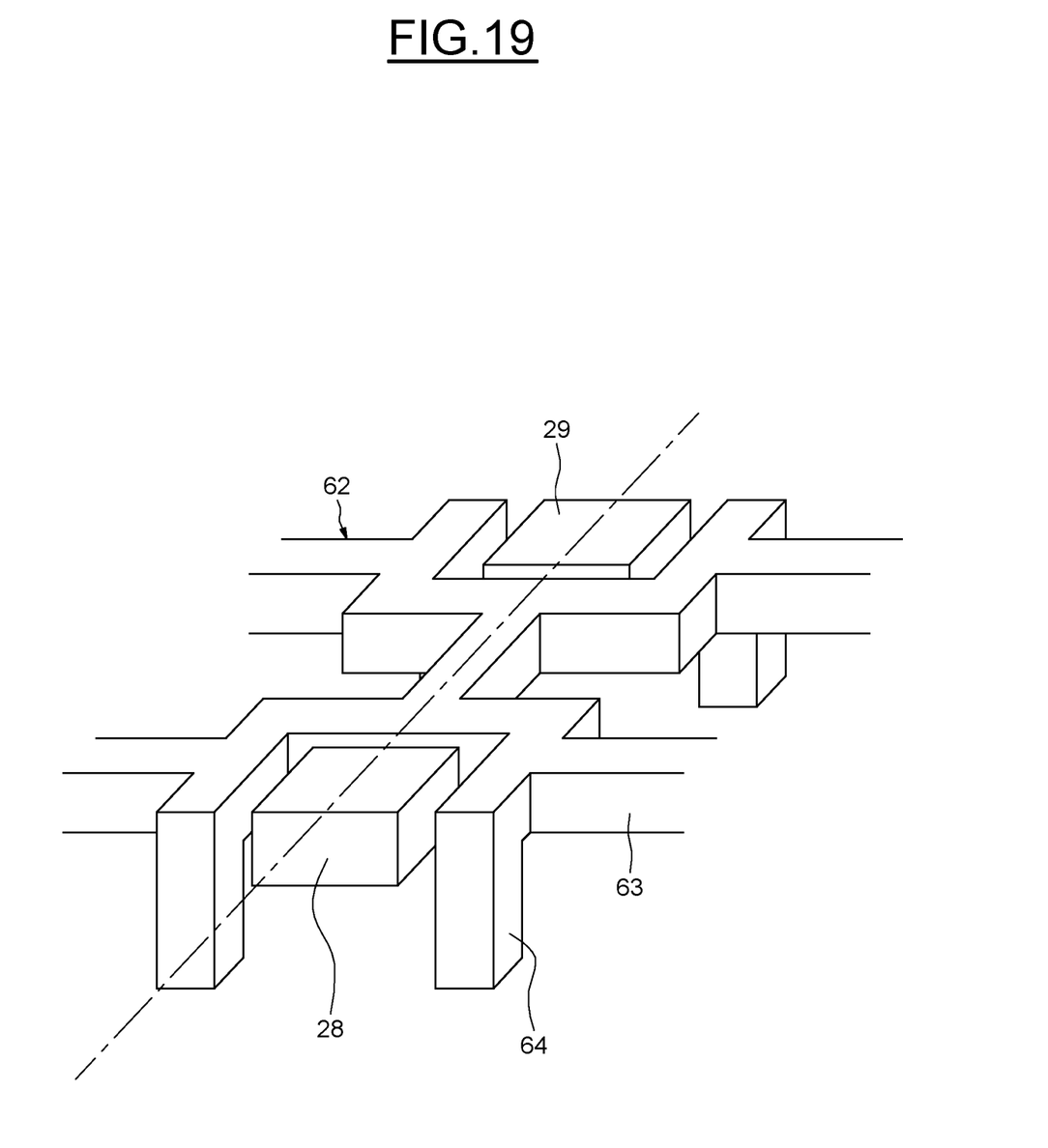
FIG. 19 shows a perspective view of a metal insert of the electronic package of FIG. 17.

FIGS. 17 to 19 illustrate one variant embodiment of the electronic package 1, in which the encapsulation cover 4 is modified, the metal insert 31 being replaced by a metal insert 62.

By replacing the plate 33, the metal insert 62 comprises an apertured plate formed by a plurality of front branches 63 that are linked to one another, and that are located at a distance from the flanks of the optical elements 28 and 29. Additionally, the metal insert 62 comprises a plurality of back branches 64 that are linked to the branches 36 and that extend backwards.

In a way equivalent to that which has been described above, the branches 63 and 64 are embedded in the cover body 30, by overmolding of the latter. The cover body 30 and the front branches 63 of the metal insert 62 have frontal faces 65 and 66 that are located in one and the same plane. The back branches extend up to the back ends of the peripheral wall of the cover body 30.

According to this variant embodiment, branches 64a of the plurality of branches 64 extend facing and a small distance from the optical elements 28 and 29, for example on three of their sides.

In a wafer-scale fabrication process, equivalent to those described above, for fabricating encapsulation covers 4 thus modified, the metal inserts 62, and then the optical elements 28 and 29, are put in place on top of the lower part 45 of the mold 44. When the mold 44 is closed, the branches 63 and the optical elements 28 and 29 make contact with the lower part 45 of the mold 44, via the adhesive layer 47a, and the back ends of the back branches 64 make contact with the upper part 46 of the mold 44.

Although the optical elements 28, 29 are shown, it will be understood that the electronic package with metal insert 62 may omit the optical elements 28, 29 when not required by the circuit or system application.

According to one variant embodiment of the electronic package 1, an equivalent electronic package comprises separate chips that are respectively entirely located within spaces delimited by an inner wall of an encapsulation cover that includes, by overmolding, a metal insert and is provided with optical elements allowing light to pass into and out of the spaces.

According to one variant embodiment of the electronic package 1, an equivalent electronic package comprises an encapsulation cover for a chip provided with an emitter or with a sensor of light radiation, this encapsulation cover including, by overmolding, a metal insert and being provided with a single optical element.

According to variant embodiments, the described arrangements may be combined.

The invention claimed is:

1. A process for fabricating at least one encapsulation cover for an electronic package, comprising:
   placing at least one optical element through which light is able to pass and at least one metal insert into a cavity defined between opposite faces of two parts of a mold, with both the at least one optical element and the at least one metal insert in contact with a first face of the opposite faces of the mold and with at least a portion of the at least one optical element in contact with a second face of the opposite faces of the mold;
   injecting a coating material into a remaining space of the cavity;
   hardening the coating material to obtain a wall that is overmolded over the at least one optical element and the at least one metal insert, so as to produce at least one encapsulation cover including the at least one metal insert and the at least one optical element and in which the at least one optical element allows light to pass through from one face to another face of the wall; and
   removing the at least one encapsulation cover from the mold.

2. The process according to claim 1, further comprising, after removing, cutting through the overmolded wall at a distance from the at least one optical element and the at least one metal insert.

3. The process according to claim 1, further comprising, prior to placing, mounting the at least one optical element in a through-passage in the at least one metal insert.

4. The process according to claim 1, wherein placing comprises positioning the at least one optical element in the cavity of the mold spaced away from the at least one metal insert by a distance.

5. The process according to claim 1, wherein for the placing the at least one metal insert is not in contact with the second face of the opposite faces of the mold.

6. The process according to claim 1, wherein for the placing the at least one metal insert is in contact with the second face of the opposite faces of the mold.

7. The process according to claim 1, wherein the second face of the opposite faces of the mold includes a groove, and wherein injecting the coating material comprises injecting the coating material into the groove, and wherein hardening the coating material comprises hardening the coating material to obtain a protruding portion of the at least one encapsulation cover.

8. The process according to claim 7, further comprising, after removing, cutting through the protruding portion and the overmolded wall to form a peripheral wall of the at least one encapsulation cover.

9. A process for fabricating a plurality of encapsulation covers for electronic packages, comprising:
   placing a first arrangement of a metal insert and an optical element through which light is able to pass into a cavity defined between opposite faces of two parts of a mold;
   placing a second arrangement of a metal insert and an optical element through which light is able to pass into the cavity defined between the opposite faces of the two parts of the mold;
   wherein the optical elements and the metal inserts are in contact with a first face of the opposite faces of the mold and wherein at least a portion of each optical element is in contact with a second face of the opposite faces of the mold;
   injecting a coating material into a remaining space of the cavity;
   hardening the coating material to obtain a wall that is overmolded over the first and second arrangements so as to produce an encapsulated structure;
   removing the encapsulated structure from the mold; and
   cutting through the encapsulated structure at a position between the first and second arrangement to produce corresponding first and second encapsulation covers.

10. The process according to claim 9, wherein the metal insert of the first arrangement and the metal insert of the second arrangement are linked by a branch.

11. The process according to claim 10, wherein cutting further comprises cutting through the branch.

12. The process according to claim 9, further comprising, prior to placing, mounting the optical elements of the first and second arrangements, respectively, in through-passages in the metal inserts of the first and second arrangements.

13. The process according to claim 9, wherein placing comprises positioning the optical elements of the first and second arrangements, respectively, in the cavity of the mold spaced away from the metal inserts of the first and second arrangements by a distance.

14. The process according to claim 9, wherein for the placing the metal inserts of the first and second arrangements are not in contact with the second face of the opposite faces of the mold.

15. The process according to claim 9, wherein for the placing the metal inserts of the first and second arrangements are in contact with the second face of the opposite faces of the mold.

16. The process according to claim 9, wherein the second face of the opposite faces of the mold includes a plurality of grooves, and wherein injecting the coating material comprises injecting the coating material into the plurality of grooves, and wherein hardening the coating material comprises hardening the coating material to obtain a corresponding plurality of protruding portions of the encapsulated structure.

17. The process according to claim 16, wherein cutting comprises cutting through the protruding portions to form a peripheral wall around each of the first and second encapsulation covers.

* * * * *